(12) United States Patent
Chocteau et al.

(10) Patent No.: US 11,770,899 B2
(45) Date of Patent: Sep. 26, 2023

(54) ELECTRONIC BOARD HAVING COMPONENTS IN CAVITIES AND SHARED SOLDER PADS AND MANUFACTURING METHOD FOR THE SAME

(71) Applicant: SAFRAN ELECTRONICS & DEFENSE, Paris (FR)

(72) Inventors: Philippe Chocteau, Moissy-Cramayel (FR); Denis Lecordier, Moissy-Cramayel (FR)

(73) Assignee: SAFRAN ELECTRONICS & DEFENSE, Paris (FR)

(*) Notice: Subject to any disclaimer, the term of this patent is extended or adjusted under 35 U.S.C. 154(b) by 104 days.

(21) Appl. No.: 17/431,653

(22) PCT Filed: Feb. 25, 2020

(86) PCT No.: PCT/FR2020/050363
§ 371 (c)(1),
(2) Date: Aug. 17, 2021

(87) PCT Pub. No.: WO2020/174181
PCT Pub. Date: Sep. 3, 2020

(65) Prior Publication Data
US 2022/0141959 A1    May 5, 2022

(30) Foreign Application Priority Data
Feb. 25, 2019   (FR) ....................................... 1901926

(51) Int. Cl.
*H05K 1/18*   (2006.01)
*H05K 3/34*   (2006.01)
*H05K 3/46*   (2006.01)

(52) U.S. Cl.
CPC ............. *H05K 1/181* (2013.01); *H05K 1/183* (2013.01); *H05K 1/184* (2013.01); *H05K 3/3494* (2013.01); *H05K 3/4697* (2013.01)

(58) Field of Classification Search
CPC .... H05K 1/14; H05K 1/141–144; H05K 1/18; H05K 1/181–187; H05K 3/181; H05K 3/3494; H05K 3/49816
(Continued)

(56) References Cited

U.S. PATENT DOCUMENTS 6,459,593 B1 * 10/2002 Kwong ............... H01L 25/0652
361/764
7,176,579 B2 * 2/2007 Konishi .............. H01L 25/0657
257/E23.125
(Continued)

FOREIGN PATENT DOCUMENTS

JP      2004-79666 A     3/2004

OTHER PUBLICATIONS

French Search Report with Written Opinion dated Dec. 12, 2019 in French Application No. 1901926.
(Continued)

*Primary Examiner* — Tuan T Dinh
(74) *Attorney, Agent, or Firm* — Sughrue Mion, PLLC

(57) ABSTRACT

An electronic circuit board includes a printed circuit board and first and second electronic components. The printed circuit board includes a first insulating layer, a second insulating layer attached to the first insulating layer and in which is formed an open cavity, and a second conductive layer attached to the second insulating layer. The second conductive layer is treated to form a surface solder pad. The first electronic component is housed in the open cavity of the second insulating layer. The second electronic component is placed on the second insulating layer without overlapping
(Continued)

with the open cavity. The first electronic component and the second electronic component each include a termination soldered on the surface solder pad, the surface solder pad being shared by the first and second electronic components.

10 Claims, 5 Drawing Sheets

(58) Field of Classification Search
USPC ............... 361/760, 764–767, 772–774, 784, 361/792–795; 174/259–262
See application file for complete search history.

(56) References Cited

U.S. PATENT DOCUMENTS

| | | | | |
|---|---|---|---|---|
| 7,586,754 | B2* | 9/2009 | Kawamura | .......... H05K 3/3452 |
| | | | | 361/767 |
| 7,592,202 | B2* | 9/2009 | Toyama | .................. H01L 23/66 |
| | | | | 257/E21.503 |
| 9,041,840 | B2* | 5/2015 | Borthakur | .............. H04N 23/54 |
| | | | | 348/302 |
| 2012/0037935 | A1* | 2/2012 | Yang | ..................... H01L 33/641 |
| | | | | 257/E33.056 |
| 2015/0262841 | A1 | 9/2015 | Kim et al. | |
| 2016/0095219 | A1* | 3/2016 | Sakamoto | ............... H01L 24/81 |
| | | | | 361/767 |
| 2016/0141234 | A1* | 5/2016 | We | ...................... H01L 23/5385 |
| | | | | 361/767 |
| 2016/0181145 | A1* | 6/2016 | Hossain | .............. H01L 25/0657 |
| | | | | 438/396 |
| 2016/0192471 | A1* | 6/2016 | Min | ..................... H05K 3/4602 |
| | | | | 361/767 |
| 2017/0181286 | A1 | 6/2017 | Campbell et al. | |
| 2017/0202083 | A1* | 7/2017 | Baek | ................. H01L 23/49833 |
| 2018/0020547 | A1 | 1/2018 | Chan et al. | |

OTHER PUBLICATIONS

International Search Report dated Jun. 18, 2020 in International Application No. PCT/FR2020/050363.
Written Opinion of the International Searching Authority dated Jun. 18, 2020 in International Application No. PCT/FR2020/050363.

* cited by examiner

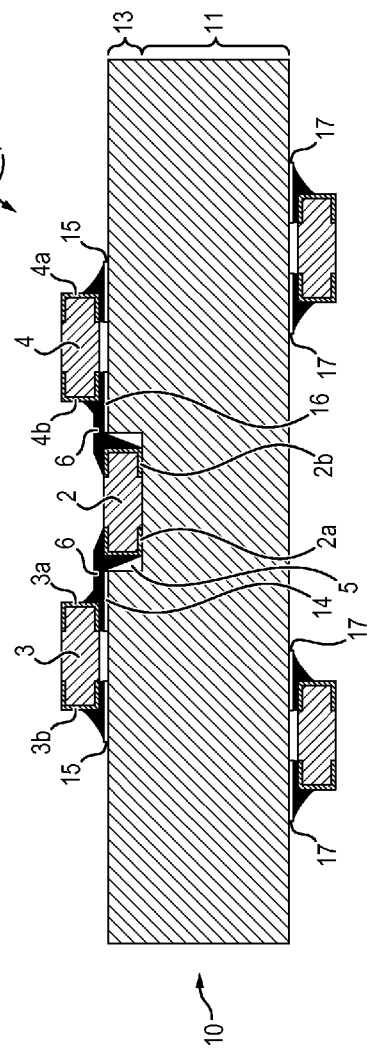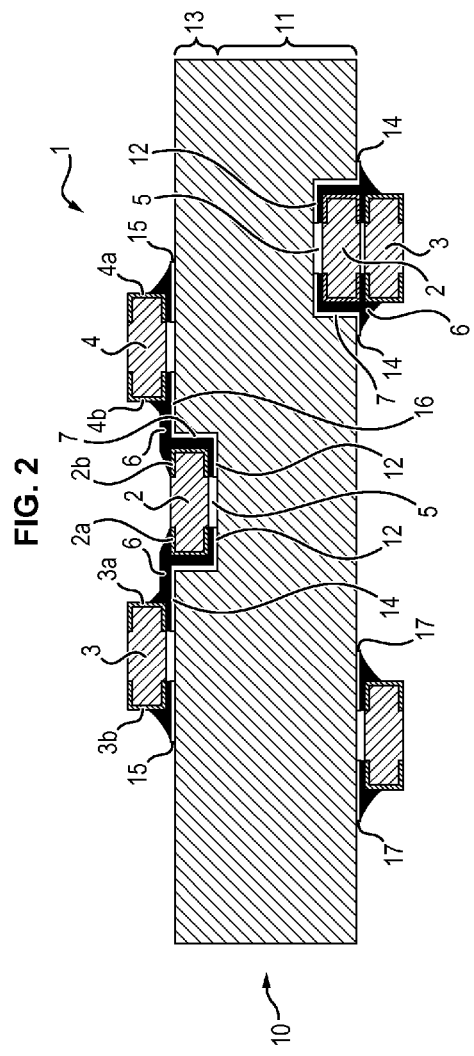

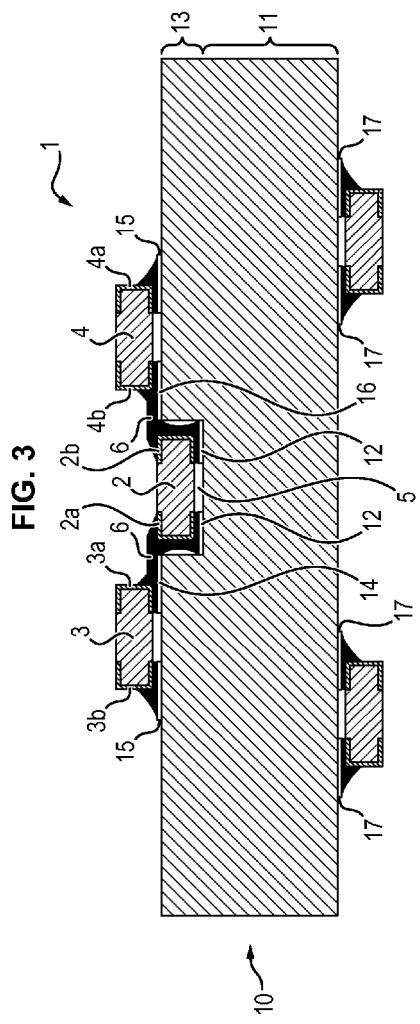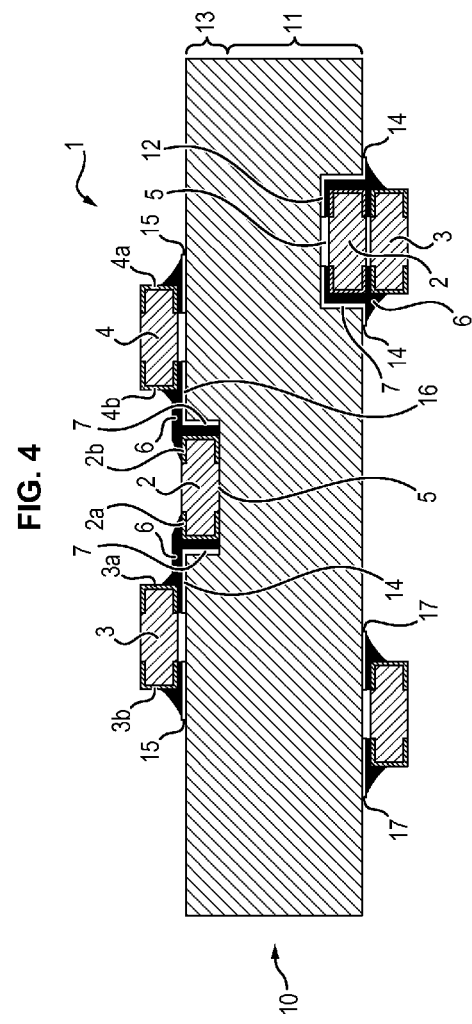

ELECTRONIC BOARD HAVING COMPONENTS IN CAVITIES AND SHARED SOLDER PADS AND MANUFACTURING METHOD FOR THE SAME

CROSS REFERENCE TO RELATED APPLICATIONS

This application is a National Stage of International Application No. PCT/FR2020/050363 filed Feb. 25, 2020, claiming priority based on French Patent Application No. 1901926 filed Feb. 25, 2019, the entire contents of each of which being herein incorporated by reference in their entireties.

FIELD OF THE INVENTION

The invention relates to the field of electronic boards, in particular when these electronic boards are intended to be integrated into a portable and embedded device, for example in the aerospace field, and more specifically the attachment of components to printed circuit boards.

TECHNICAL BACKGROUND

In a manner known per se, an electronic board can comprise surface-mount components (CMS), i.e. electronic components soldered directly onto the surface of the printed circuit board of an electronic board, through components, or other printed circuit boards.

Usually, CMS are surfaced-soldered either by reflow soldering or by wave soldering.

In the case of reflow soldering, the bare printed circuit board is first stenciled by covering the conductive layers of the printed circuit board (generally made of copper) with a soldering paste, using a stencil such that only the locations intended to receive the terminations of the components are covered by the soldering paste. Soldering paste comprises, in a manner known per se, a metallic alloy in suspension in a solder flux. Then the terminations of the components (CMS) are placed on the soldering paste before undergoing a reflow heat treatment, during which the heat makes the alloy reflow and the solder flux evaporate in such a way as to form solder joints from the metallic alloy present in the soldering paste.

In order to increase the packaging density of the components of a printed circuit board comprising surface-mount components, the document US 2014/158414 makes provision for burying components in the printed circuit board. More precisely, a cavity is made by laser cutting into the printed circuit board, after its manufacturing, such as to reveal solder pads at the bottom of the cavity. The component is then placed at the bottom of the cavity and soldered on the solder pads, then the electronic board is stenciled in order to sink the component into an insulating layer. This solution thus makes it possible to free up space on the skin layer of the electronic board. However, the insulating layer into which the component is sunk prevents the replacement of the components in the event of their failure and complicates the development phase of the electronic board. In addition, the burying the components modifies the supply chain and increases the manufacturing cost of the printed circuit board, since the components must be assembled by the printed circuit board supplier.

In the document FR 3 069 127 on behalf of the Applicant provision has also been made for a method for manufacturing an electronic board comprising a multi-layer printed circuit board having at least four conductive layers separated pairwise by insulating layers, including:
a first and a second conductive skin layer attached to a first and a second insulating layer, respectively, the first conductive skin layer being substantially planar and defining a plane normal to an axis Z,
a first and a second inner conductive layer, extending between the first and the second insulating layer, respectively, and separated by a third insulating layer, at least the first inner conductive layer being treated in such a way as to form at least one solder pad.

A first cavity is formed in the first conductive skin layer and in the first insulating layer, facing the solder pad of the first inner conductive layer, such that at least a part of the solder pad is revealed. This cavity is then filled with a metallic alloy accompanied by a solder flux, for example soldering paste, then an electronic component is placed facing the first cavity. Finally, a heat treatment of reflow type is applied to the printed circuit board on which the component is placed in order to transform the metallic alloy accompanied by the solder flux at the solder joint in such a way as to attach the first component to the printed circuit board.

This method thus makes it possible to efficiently increase the packaging density and mixability of surface-mount components by creating cavities making it possible to reduce the overall dimensions of the electronic board, while allowing the replacement of defective CMS.

These methods have thus already made is possible to increase the packaging density of components in an electronic board. However, the aerospace industry remain constantly in search of improvements in electronic boards. This is particularly the case in the field of differential filters for which several discrete electronic components must be connected together. This is because the differential filter is more efficient the closer its electronic components are. However, the manufacturing tolerances, conversely, require the electronic components to be separated enough to avoid them adhering to one another during the soldering step, since such adhesion has the effect of deforming the solder joints and thus drastically reducing their lifetime.

The document US 2015/262841 describes an electronic board comprising a printed circuit board comprising an insulating layer in which is formed a cavity and a surface solder pad attached to the insulating layer. An electronic component is placed in the cavity, while one or more electronic components are surface-soldered above this cavity. The cavity is also filled with a protective resin and the component or components placed on the cavity are stacked using layers of adhesive layer. This configuration makes it possible to increase the packaging density. However, such an electronic board is difficult to repair, since the components are less accessible than when they are all placed on one and the same surface, as they are not very accessible.

The documents US 2018/020547 and US 2017/0181286 describe an electronic board comprising a printed circuit board comprising an insulating layer in which is formed a cavity and a solder pad on the surface attached to the insulating layer. An electronic component is placed in the cavity, while one or more electronic components are soldered above this cavity, at the surface. However, as in the document US 2015/262841, these electronic boards are not optimal in terms of repairability/replacement of the components.

SUMMARY OF THE INVENTION

One aim of the invention is therefore to make provision for a new method making it possible to further increase the packaging density and mixability of electronic components on a printed circuit board, without reducing their lifetime, by making it possible to assemble a variety of components without limitations, whether these components are fine-pitch or large-size components, whatever the shape of their terminations, this new method being moreover simple to produce and of moderate cost without this affecting the assembly yield of the electronic board.

To do this, the invention makes provision for an electronic board comprising:
- a printed circuit board comprising a first insulating layer, a second insulating layer attached to the first insulating layer and in which is formed an open cavity and at least a second conductive layer attached to the second insulating layer, said second conductive layer being treated such as to form at least one surface solder pad, and
- at least a first electronic component and at least a second electronic component, the first electronic component being housed in the cavity of the second insulating layer.

Moreover, the second electronic component is placed on the second insulating layer and in that the first electronic component and the second electronic component each comprise a soldered termination on the surface solder pad, the second electronic component being placed on the second insulating layer without overlapping with the cavity.

Thus, the solder pad is shared by a surface-mount component (i.e. in the surface plane) and a component in a cavity.

Such configuration proves particularly advantageous in terms of cost and overall dimensions owing to the use of a shared monolithic solder joint which connects their respective terminations and therefore removes the need to space the components apart.

Furthermore, since the cavity is an open cavity, the first electronic component is accessible. (It is neither sunk, nor buried in the insulating layers). It is therefore easily reparable or replaceable, by comparison for example with components which are buried or sunk (i.e. with a cavity which is not an open cavity or is filled with an insulating material).

Certain preferred but non-limiting features of the electronic board are as follows, taken individually or in combination:
- the electronic board further comprises at least a first conductive layer attached between the first insulating layer and the second insulating layer and being treated such as to form at least one solder pad at the bottom of the cavity, said cavity-bottom solder pads being at least partly revealed by the cavity and the termination of the first electronic component being also soldered on the cavity-bottom solder pad.
- the cavity has a side wall extending between the first conductive layer and the surface solder pad, said side wall being metallized.
- the second electronic component comprises a printed circuit board on which are assembled one or more electronic components, a surface-mount component.
- the first electronic component and/or the second electronic component comprise at least one additional termination, said additional terminations being soldered on the second additional solder pads formed in the second conductive layer.
- the first electronic component and the second electronic component comprise several terminations sharing pairwise a corresponding surface solder pad.
- the electronic board further comprises an additional surface solder pad formed in the second conductive layer and a third electronic component, placed on the second insulating layer without overlapping with the cavity, the first electronic component and the third electronic component each comprising a termination soldered on the additional surface solder pad.
- the second electronic component is placed on the second insulating layer without overlapping with the cavity.
- the second electronic component is placed on the second insulating layer such as to at least partially cover the cavity.

According to a second aspect, the invention makes provision for a differential filter comprising an electronic board as described above.

According to a third aspect, the invention makes provision for a method for manufacturing an electronic board as described above or a differential filter as described above comprising the following steps:
- supplying a printed circuit board comprising a first insulating layer, a second insulating layer attached to the first insulating layer and at least a second conductive layer attached to the second insulating layer, said second conductive layer being treated such as to form at least one surface solder pad and comprising an open cavity formed in the second insulating layer,
- placing at least a first electronic component in the cavity,
- placing at least a second electronic component on the second insulating layer,
- soldering a termination of the first electronic component and a termination of the second electronic component on the surface solder pad.

Certain preferred but non-limiting features of this manufacturing method are as follows, taken individually or in combination:
- the soldering step is produced by wave soldering and/or by reflowing.
- the method further comprises an additional step during which the soldering paste comprising a metallic alloy in suspension in a solder flux is applied to the at least one surface solder pad, said additional step being performed before or after the insertion of the first electronic component into the cavity.
- during the step of placing the at least one first electronic component, said first electronic component is put in position at the bottom of the cavity.
- the method further comprises a step of attaching a metal layer on the second insulating layer and producing a cavity having a predefined pattern through said metal layer and the second insulating layer such as to form a mark.

BRIEF DESCRIPTION OF THE DRAWINGS

Other features, aims and advantages of this invention will become apparent on reading the following detailed description, with reference to the appended drawings given by way of non-limiting example and wherein:

FIGS. 1 to 4 are side views of several variants of an exemplary embodiment of an electronic board in accordance with the invention.

DETAILED DESCRIPTION OF AN EMBODIMENT

Figure 5:
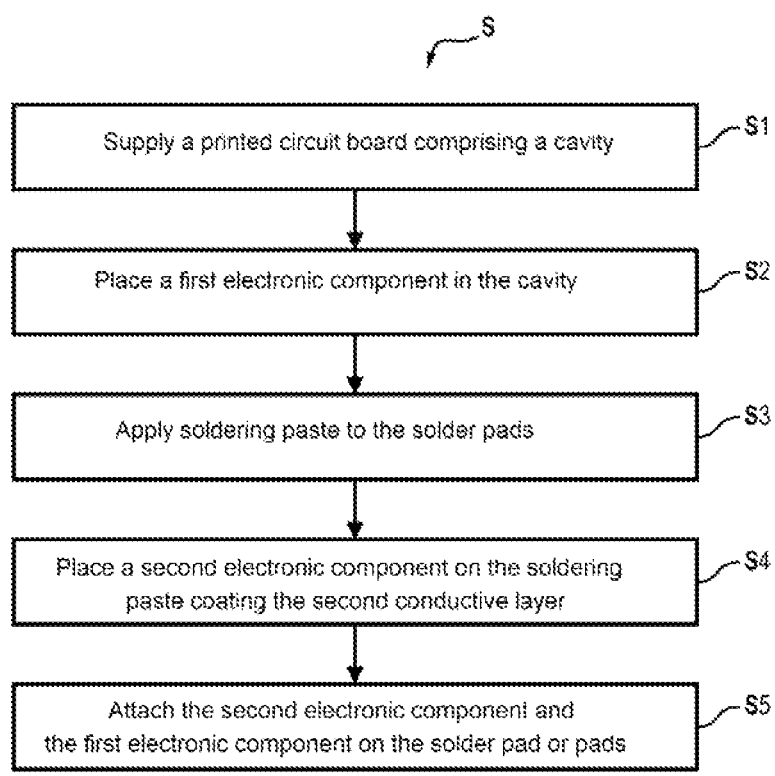
FIG. 5 is a block diagram showing different steps of a method for manufacturing an electronic board in accordance with a first embodiment of the invention.
Figure 6:
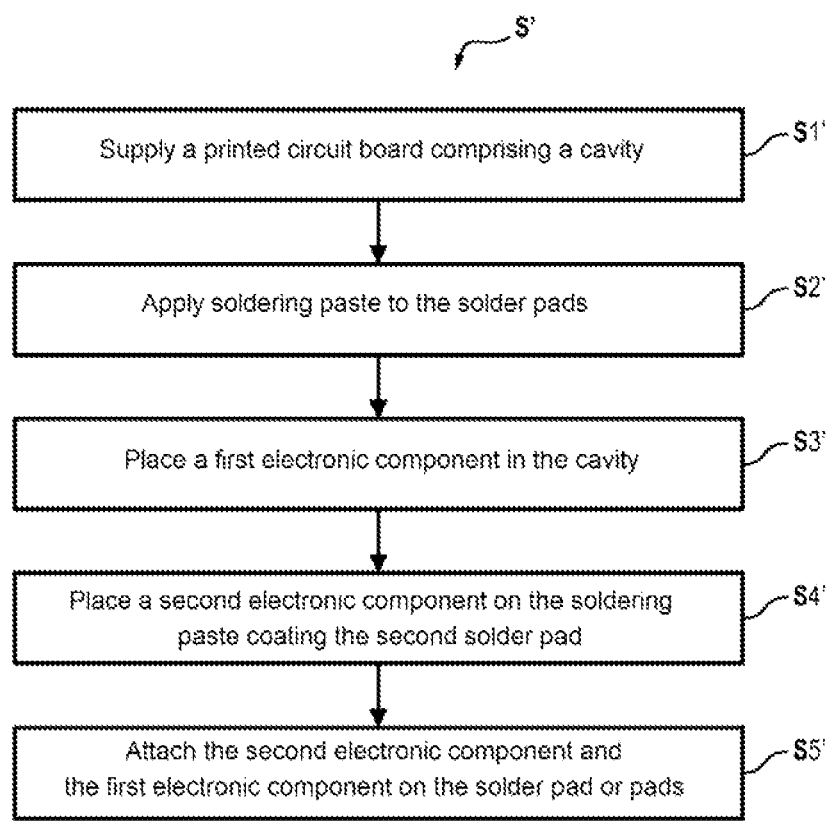
FIG. 6 is a block diagram showing different steps of a method for manufacturing an electronic board in accordance with a second embodiment of the invention.

An electronic board 1 comprises a printed circuit board 10, including conductive layers separated by insulating layers onto which electronic components are attached.

In general, a printed circuit board 10 can be of single-layer (also known as single-layer) type and comprise only a single conductive layer, bi-layer (also known as double-sided) and comprise a conductive layer on either side of an insulating layer 11, 13 or multilayer and comprise at least four conductive layers.

The insulating layers 11, 13 may comprise, in a manner known per se, an Epoxy resin and fiber glass. The conductive layers, meanwhile, can be made of copper (or a copper alloy).

The term "electronic component" should be understood to mean in the text below any element intended to be assembled with others to perform one or more electronic functions. By way of non-limiting example, an electronic component may comprise a discrete electronic component such as a surface-mount component (CMS) (typically a resistor, a capacitor, a BGA (Ball Grid Array etc.) or a through component, or else a printed circuit board to which one or more discrete electronic components are attached.

An electronic board 1 comprises a printed circuit board 10, at least a first electronic component 2 and a second electronic component 3. The printed circuit board 10 can be single-layer, bi-layer or multi-layer.

The printed circuit board 10 comprises a first insulating layer 11 and a second insulating layer 13 attached to the first insulating layer 11. As will be seen below, the first insulating layer 11 and the second insulating layer 13 can be formed entirely out of a single part or in a variant be separated by a first conductive layer treated such as to form at least one cavity-bottom solder pad 12.

A second conductive layer is attached to the second insulating layer 13 opposite the first insulating layer 11. The second conductive layer is treated such as to form at least one surface solder pad 14. An open cavity 5, which houses the first electronic component 2, is formed in the second insulating layer 13. The term "through" should here be understood to mean that the cavity is not sealed and is open at the level of the surface of the second insulating layer 13.

In order to increase the packaging density of the electronic components of the electronic board 1 and to allow, where applicable, their mixability, the second electronic component 3 is placed on the second insulating layer 13, with or without overlapping with the cavity 5. Moreover, the first electronic component 2 and the second electronic component 3 each comprise a termination 2a, 3a which is soldered on the surface solder pad 14 formed in the second conductive layer. In other words, the first and the second electronic component 2,3 share one and the same surface solder pad 14, such that their solder joints 6 are monolithic on this surface solder pad 14. This sharing—with a shared solder pad and a monolithic solder joint connecting the respective terminations of the components—therefore creates a connection between the first and the second electronic component 2, 3, allowing substantial savings in surface area by comparison with the prior art which, usually, separated electronic components from one another to avoid their adhesion during soldering (and particularly during the reflowing step).

By placing the first electronic component 2 in the cavity 5, one thus avoids any risk of the first electronic component 2 and the second electronic component 3 bonding side-by-side due to their proximity, while reducing the distance separating them. The first electronic component 2 specifically remains housed in the cavity 5. The sharing of the surface solder pad 14 thus makes it possible to increase the packaging density of the components without risking deformation of the solder joints 6, which also makes it possible to increase their lifetime.

The second electronic component 3 can be placed on the second insulating layer 13 such as not to overlap the cavity (FIGS. 1 to 4). In a variant, the second electronic component 3 can be placed on the second insulating layer 13 such as to at least partially cover the cavity 5 (FIGS. 2 and 4). In this variant embodiment, the first electronic component 2 and the second electronic component 3 are therefore superimposed, which makes it possible to increase the packaging density of the components without however risking deformation of the solder joints 6.

Such a technology has a particular application when the electronic component includes a differential filter. This is because it becomes possible to connect discrete electronic components 2, 3 together by soldering them on one and the same surface solder pad 14, one of the electronic components being housed in a cavity 5 while the other is placed at the surface near the cavity 5. Advantageously, the electronic components 2, 3 soldered on one and the same surface solder pad 14 are also brought closer together, by comparison with the prior art which separates them to avoid the solder joint becoming deformed, which also makes it possible to increase the efficiency of the differential filter which is directly related to the distance between the electronic components.

It will be noted that the cavity 5 is an open cavity such that the first electronic component 2 is not buried or sunk into an insulating layer but simply housed in said cavity 5. The first electronic component 2 therefore remains reparable, since access to it is not blocked by insulating layers. In addition, as shall be seen hereinafter, the method of assembly of the electronic board 1 remains quite similar to current methods. In particular, the standard machines and processes for assembly (and particularly soldering) can be used, which simplifies its implementation on the industrial scale.

The term "housed" is here understood to mean that the first electronic component 2 is substantially contained in the cavity 5, i.e. it is flush with the free face of the first insulating layer 11, it is depressed with respect to the free face of the printed circuit board 10 (i.e. distant from the free face, inside the cavity 5) or it slightly protrudes therefrom (at a very small distance from the free face). In all cases, at the most 10% of the height of the electronic component projects past the cavity 5.

In the exemplary embodiments illustrated in the figures, the printed circuit board 10 is bilayer and comprises electronic components 6 soldered on the face opposite the second conductive layer. This is not limiting. The printed circuit board 10 can be single-layer or multi-layer. Moreover, since the first and second conductive layers have been treated such as to form solder pads, only the corresponding solder pads are shown and referenced in the figures.

In a first embodiment illustrated in FIG. 3, the printed circuit board 10 further comprises the first conductive layer treated such as to form at least one cavity-bottom solder pad 12. Moreover, the cavity 5 opens onto this cavity-bottom solder pad 12 such as to reveal it. The termination 2a of the first electronic component 2 is then soldered onto the cavity-bottom solder pad 12, at the bottom of the cavity 5, in addition to the surface solder pad 14.

In a second embodiment illustrated in FIG. 2, the printed circuit board 10 comprises the first conductive layer treated such as to form at least one cavity-bottom solder pad 12 and the cavity 5 opens onto this cavity-bottom solder pad 12 such as to reveal it. Moreover, the walls of the cavity 5 are metallized such as to connect the cavity-bottom solder pad 12 and the surface solder pad 14. The termination 2a of the first electronic component 2 is then soldered on the 12, at the bottom of the cavity 5, on the surface solder pad 14 and on the metallic walls 7 of the cavity.

In a third embodiment illustrated in FIG. 1, the printed circuit board 10 is devoid of any solder pad at the bottom of the cavity 5, the walls of which are not metallized. The termination 2a of the first electronic component 2 is therefore soldered only on the surface solder pad 14. In this variant embodiment, the first insulating layer 11 and the second insulating layer 13 can therefore be formed entirely out of a single part or assembled, for example by bonding, such as to form a monolithic block.

In a fourth embodiment illustrated in FIG. 4, the first printed circuit board 10 is devoid of any solder pad on the bottom of the cavity 5. On the other hand, the second conductive layer is treated such as to form the at least one surface solder pad 14 and the walls of the cavity 5 are metallized. The termination 2a of the first the electronic component 2 is then soldered on the surface solder pad 14 and on the metallized walls 7 of the cavity.

Of course, when the printed circuit board comprises several cavities 5 in each of which are housed at least a first electronic component 2, each first electronic component 2 can be soldered on the printed circuit board as claimed in any of the variant embodiments described above. In particular, not all the electronic components 1 of one and the same printed circuit board are necessarily soldered in the same way, so that the soldering technique can be adapted to the types of terminations of the different electronic components.

Finally, one and the same cavity 5 can house several electronic components, each soldered on an associated surface solder pad 14.

The first and the second electronic component 2, 3 can each comprise several terminations 2b, 3b, which are each soldered on one additional surface solder pad 15, 16 formed in the second conductive layer. Where applicable, the additional termination or terminations of the first electronic component 2 can, where applicable, also be soldered on one or more associated first additional solder pads 12 at the cavity bottom 5. For example, FIGS. 1 to 4 illustrate a first electronic component 2 with two visible terminations 2a, 2b, one of the terminations 2a being soldered on the surface solder pad 14, which is shared with the second electronic component 3, the other of the terminations 2b extending opposite and being soldered on the surface solder pad 16. The second electronic component 3 meanwhile also has two visible terminations 3a, 3b, one of these terminations 3a being soldered on the surface solder pad 14, which is shared with the termination 2a of the first electronic component 2, the other of the terminations 3b extending opposite and being placed at a distance from the cavity 5 and from the surface solder pad 14.

In practice, it is the configuration of the terminations 2a, 3a and the dimensions of the first and of the second electronic component 2, 3 which determine the dimensions of the cavity 5, the number of solder pads 14, 15 and their position on the second insulating layer 13.

Where applicable, the first and the second electronic component 2, 3 may also comprise several terminations 2a, 3a sharing pairwise a corresponding surface solder pad 14.

In an embodiment, the electronic board 1 can comprise additional electronic components.

In a first exemplary embodiment, the printed circuit board can be bilayer or multi-layer and comprise a third conductive layer, extending opposite the second conductive layer with respect to the first insulating layer 11, treated so as to form one or more third solder pads 17. Electronic components can then be soldered on third solder pads 17. Where applicable, one of these third solder pads 17 can be shared by two adjacent electronic components, as has been described for the surface solder pad 14. Thus, an open cavity 5 can also be formed in the insulating layer on which the conductive layer is attached in order to house one of the electronic components there and at least one of the terminations of this electronic component can be soldered on a solder pad shared with another electronic component such as to form only a single shared solder joint.

In another exemplary embodiment, which can be combined with the first, a third electronic component 4 can be soldered on at least one additional surface solder pad 16 formed in the second conductive layer. Optionally, this third electronic component 4 and the first electronic component 2 may each comprise a termination 2b, 4b soldered on the additional surface solder pad 16. Thus, the first electronic component 1 shares a surface solder pad 16 and has a first solder joint 6 shared with the second electronic component 3 and a second solder joint 6 shared with the third electronic component 4.

Preferably, the first electronic component 2 comprises a discrete electronic component of CMS type.

The second electronic component 3, meanwhile, can comprise a discrete electronic component of CMS type or at least one printed circuit board on which one or more electronic components are assembled.

An electronic board 1 in accordance with the invention may be obtained in accordance with the following manufacturing steps.

In a first embodiment S, the soldering paste is stenciled above the first electronic component or components 2, prepositioned in the cavity 5, and the second electronic component or components 3 on top are put in position after soldering paste coating the second insulating layer 13, after the screen printing step.

To do this, during a first step S1, a printed circuit board 10 is supplied. This printed circuit board 10 comprises the first insulating layer 11, the second insulating layer 13 attached to the first insulating layer 11, at least a second conductive layer attached to the second insulating layer 13 and where applicable a first conductive layer extending between the first and second insulating layer 11, 13. This second conductive layer is pre-treated such as to form at least one surface solder pad 14, 15, 16 or, during a sub-step, is treated such as to form the second solder pad or pads 14, 15, 16. At least one of the second solder pads 14, 16 is formed close enough to the cavity 5 to allow the soldering of an electronic component housed in the cavity 5.

For example, each solder pad 12, 14, 15, 16 may be obtained by etching the corresponding conductive layer.

The second insulating layer 13 may already be present on the printed circuit board or be applied to the first insulating layer 11 by any means. For example, in a first form of embodiment, the second insulating layer 13 can be applied by surface photolithography on the first insulating layer 11 (or, where applicable, the first conductive layer). In this case, these cavities 5 can also be formed by surface photolithography. The reader is notably referred to the document FR 3 069 128 on behalf of the Applicant for more details on the production techniques of the cavity 5.

In a second embodiment, the second insulating layer 13 may be added and attached to the first insulating layer 11 (or where applicable the first conductive layer), for example by lamination or bonding using an adhesive layer. The adhesive layer may comprise any type of adhesive material conventionally used in the field of printed circuit boards to bond layers together, typically an Epoxy resin. The cavity or cavities 5 may then be preformed in the second insulating layer 13 before the latter is placed on the connecting face, or else after its attachment. For example, the cavity or cavities 5 may be formed by cutting the second insulating layer 13. The cutting can be carried out mechanically (using a cutting tool of mechanical machining or mechanical drilling or laser drilling type before placement on the first insulating layer 11) or by chemical process. The reader is also referred to document FR 3 069 128 on behalf of the Applicant for more details on the production techniques of the cavities 5.

Optionally, according to the variant embodiment chosen for the soldering of the first electronic component 2, the walls of the cavity 5 can be metallized.

During a second step S2, at least a first electronic component 2 is placed in the cavity 5. The first electronic component 2 is preferably positioned such as to be completely housed in this cavity 5 or be depressed with respect to the free surface of the second insulating layer 13 or be flush with said surface. This makes it possible to apply the soldering paste by screen printing on the two solder pads 14, 15, 16. In a variant, the first electronic component can be slightly protruding from the cavity 5.

In any event, the first electronic component 2 is placed at the bottom of the cavity 5. In other words, the first electronic component 2 is in contact with the bottom of the cavity 5, and not distant from it. Advantageously, the second electronic component 3 can then be found a very small distance away from the surface of the second electronic component 3 (less than 50 micrometers), since the terminations 2a and 2b of the first electronic component 2 do not extend over the second solder pads 14 and 16 but underneath the surface (or are flush with the surface) of the second insulating layer 13.

In addition, when the first electronic component 2 is soldered on at least a second pad 14, 15, 16, the terminations 2a, 2b of the first electronic component 2 are then located under the associated solder pads, inside the cavity 5, which makes it possible to increase the distance between the solder pad and the termination of the electronic component 2 and thus to limit the stresses undergone by the solder joints when the electronic board 1 is exposed to a harsh environment in terms of temperature, vibration or shock.

Optionally, a dot of adhesive can be applied to the bottom of the cavity 5 to hold the first electronic component 2 in position in the cavity 5 during its soldering. The adhesive for example comprises an Epoxy adhesive such as a LOC-TITE® 3609 adhesive.

During a third step S3, soldering paste comprising a metallic alloy in suspension in a solder flux is applied to the electronic board conductive pad or pads and to the terminals 2a, 2b of the first electronic component or components 2, for example by screen printing, while the first electronic component or components 2 are placed in the cavity 5.

For example, if the first printed circuit board 10 does not comprise any cavity-bottom solder pad 12 revealed at the bottom of the cavity 5, the soldering paste is applied to the second solder pads 14, 15, 16 and to the terminations 2a, 2b.

If the first printed circuit board 10 comprises first solder pads 12 revealed at the bottom of the cavity 5, soldering paste is of course also applied to these solder pads 12, by screen printing and/or by dispensing using a nozzle or a needle. Preferably, the dispensing is done prior to the screen printing, for example prior to the placement of the first electronic component 2 in the cavity (between steps S1 and S2).

Optionally, soldering paste can be applied, for example by dispensing, to the terminations 2a, 2b of the first electronic component 2. This specifically makes it possible to prepare the surface of the top of the terminations 2a and 2b and to allow the soldered joint to also be produced on this surface. If the cavity 5 does not comprise any cavity-bottom solder pad 12 (see for example FIGS. 1 and 4, third and fourth variant embodiments), this also makes it possible to avoid the first electronic component 2 rising back up above the free surface of the second insulating layer 13 under the effect of the wetting forces.

During a fourth step S4, at least a second electronic component 3, and where applicable a third electronic component 4, are placed on the soldering paste coating the second conductive layer 13, with or without overlapping with the cavity 5 and close to the second solder pad or pads 14, 16.

During a fifth step S5, a heat treatment is applied to the electronic board 1 such as to attach the first electronic component 2, the second electronic component 3 and where applicable the third electronic component 4 to the second solder pad or pads 14, 15, 16 such as to form one or more monolithic shared solder pads 6.

The heat treatment typically comprises a reflowing treatment for the metallic alloy present in the soldering paste to obtain solder joints 6. Here again, the reader is referred to the document FR 3 069 128 on behalf of the Applicant for more details on reflowing soldering.

The first electronic component 2 and the second electronic component are therefore soldered simultaneously on the electronic board 1. The flux of the soldering paste therefore simultaneously prepares the surface of the top of the termination 2a of the first electronic component 2 and of the bottom of the termination 3a of the second electronic component 3, thereby improving the manufacturing yield.

This embodiment S thus makes it possible to use a proven and industrially developed soldering technique and to increase productivity since the electronic component 2, 3, 4 can be soldered simultaneously, without substantially modifying the configuration of the production lines.

In a second embodiment S', the soldering paste is stenciled prior to the placement of the first and second electronic component(s) 2, 3 on the electronic board 1.

To do so, a first printed circuit board 10 is supplied during a first step S1'. This step is identical to the first step S1 of the first form of embodiment.

During a second step S2', soldering paste comprising a metallic alloy in suspension in a soldering flux is applied to the conductive pads 14, 15, 16 of the electronic board 1, for example by screen printing, as well as in the cavity 5 in the location where the terminations 2a, 2b of the first electronic component 2 are to be placed. At this time the first, second and where applicable third electronic components 2, 3, 4 are not yet placed on the electronic board 1.

For example, if the first printed circuit board 10 does not comprise any cavity-bottom solder pad 12 revealed at the bottom of the cavity 5, the soldering paste is applied to the second pads 14, 15, 16 and in the cavity 5, in the location intended to receive the terminations 2a and 2b.

However, when the first printed circuit board 10 comprises one or more first solder pads 12 revealed at the bottom of the cavity 5, soldering paste is of course also applied to these pads 12.

Optionally, soldering paste can be applied for example by dispensing, to the terminations 2a, 2b of the first electronic component 2. This specifically makes it possible to prepare the surface of the top of the terminations 2a and 2b and allow the soldered joint to be also produced on this surface. If the cavity does not comprise any cavity-bottom solder pad 12 (see for example FIGS. 1 and 4, third and fourth variant embodiments), this also makes it possible to avoid the first electronic component 2 rising back up above the free surface of the second insulating layer 13 under the effect of the wetting forces.

The third and fourth steps S3' and S4' are then identical to the second and fourth steps S2, S4 of the first form of embodiment.

In particular, during the third step S3', at least a first electronic component 2 is placed in the cavity 5 by being put in position on the bottom of it. To do this, the first electronic component 2 can in particular be depressed into the soldering paste that has been stenciled in the cavity 5, to guarantee that the component 2 is indeed at the bottom of the cavity 5.

Optionally, a dot of adhesive can be applied to the bottom of the cavity 5.

During the fourth step S4', the second electronic component 3 is placed on the soldering paste coating the surface solder pad 14 (and where applicable the surface solder pad 16). The second electronic component 3 can be placed either such as not to overlap the cavity (examples illustrated in FIGS. 1 to 4) or in a variant on top of the first component 2, at least partially overlapping the cavity 5 (exemplary embodiment illustrated in FIGS. 2 and 4).

Where applicable, a third electronic component 4 can be placed on the soldering paste coating the surface solder pad 14 and the additional surface solder pad 15.

During a sixth step S5', identical to the fifth step S5 of the first form of embodiment, a heat treatment is applied to the electronic board 1 such as to attach the first electronic component 2 in the cavity 5, the second electronic component 3 and where applicable the third electronic component 4 on the surface solder pad 14.

The electronic components 2, 3, 4 are thus once again soldered simultaneously on the electronic board 1, thus improving the manufacturing yield, using a proven and industrially developed soldering technique.

Whatever the embodiment (screen printing after placement of the first electronic component 2 or beforehand), the first electronic component 2 is inserted into the cavity 5. To do this, in a manner known per se, the depositing machines usually use two printed masks on the surface of the printed circuit board allowing them to determine the position of the printed circuit board, solder pads etc., in the reference frame of the masks in order to apply the soldering paste during screen printing and to deposit the electronic components.

The Applicant has however noticed that the dimensional and positional tolerances of the cavity 5 in the second conductive layer 13 were such that the cavity 5 could be offset by 150 micrometers in each direction with respect to the reference frame defined by the masks. However, as we have seen above, it is necessary to introduce the first electronic component 2 into the cavity 5.

To allow the introduction of the first electronic component 2 into the cavity 5 on the industrial scale, one possibility is therefore to increase the dimension of the cavity 5. This specifically makes it possible to guarantee that, despite the positional tolerance, the first electronic component 2 can be introduced into the cavity 5 in an automated manner. However, this has the consequence of increasing the dimension of the cavities by 300 micrometers along two directions, which is significant for small components.

Alternatively, in place of the conventional masks, the first printed circuit board 10 can comprise cavities 8b formed in the second insulating layer 13 and playing the role of marks 8. These cavities 8b are then formed during the same pass as the cavity 5 (or cavities 5) configured to receive a first electronic component 2, which makes it possible to dispense with the offsetting of the cavities 5 with respect to the solder pads 14 and increase the certainty regarding the position of the cavities 5 in the reference frame of the cavities 8b forming the marks 8. For example, the cavities 8b forming the marks 8 and the cavities 5 can be produced using one and the same tool, by machining or laser cutting.

Such marks 8 can for example be obtained by attaching a metal layer 8a to the surface of the first printed circuit board 10 and by hollowing out this metal layer 8a and the second insulating layer 13 following a predefined pattern such as to form the cavity 8b and obtain the mark 8. The metal layer 8a serves as a screen, the cavity 8b traversing the metal layer 8a allowing, by contrast, the formation of the pattern.

The metal layer 8a can for example comprise copper. It can be of similar shape to conventional marks, for example of square shape. Moreover, the cavity 8b can have a section (in the plane of the metal layer) in the shape of a cross, a square, or a triangle, or comprise one or more concentric circles, or any other shape able to form a target.

Figure 7:
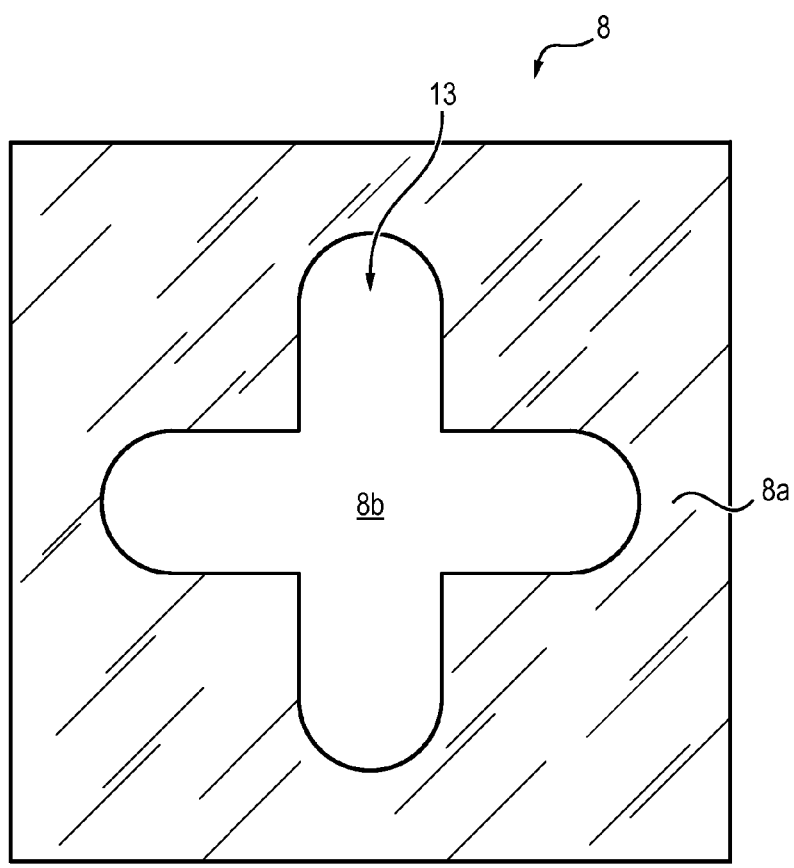
FIG. 7 is an exemplary embodiment of a cavity forming a mark that can be used in a manufacturing method in accordance with the invention.

An example of a mark 8 has been illustrated in FIG. 7.

The invention claimed is:

1. An electronic circuit board comprising:
    a printed circuit board comprising a first insulating layer, a second insulating layer attached to the first insulating layer and in which is form an open cavity, and at least a second conductive layer attached to the second insulating layer, wherein the second conductive layer is treated such as form a surface solder pad; and
    a first electronic component and a second electronic component;
    wherein the first electronic component is housed in the open cavity of the second insulating layer;
    wherein the second electronic component is placed on the second insulating layer without overlapping with the open cavity; and
    wherein the first electronic component and the second electronic component each comprises a termination soldered on the surface solder pad, the surface solder pad being shared by the first electronic component and the second electronic component;
    wherein a single solder joint directly contacts the termination of the first electronic component, the termination of the second electronic component, and the surface solder pad.

2. The electronic board of claim 1, further comprising a first conductive layer attached between the first insulating layer and the second insulating layer, wherein the first conductive layer is treated such as to form an additional solder pad at a bottom of the open cavity, the additional solder pad being at least partly revealed by the open cavity and the termination of the first electronic component being also soldered on the additional solder pad.

3. The electronic board of claim 1, wherein the second electronic component comprises a printed circuit board on which are assembled at least one electronic component.

4. The electronic board of claim 1, wherein at least one of the first electronic component and the second electronic component comprises an additional termination, the additional terminations being soldered on additional surface solder pads formed in the second conductive layer.

5. The electronic board of claim 1, further comprising an additional surface solder pad formed in the second conductive layer and a third electronic component, placed on the second insulating layer without overlapping with the open cavity, the first electronic component and the third electronic component each comprising a termination soldered on the additional surface solder pad.

6. The electronic board of claim 2, wherein the open cavity has a side wall extending between the first conductive layer and the surface solder pad, said side wall being metallized.

7. A method for manufacturing an electronic board, the method comprising:

supplying a printed circuit board comprising a first insulating layer, a second insulating layer attached to the first insulating layer and, and a second conductive layer attached to the second insulating layer, wherein the second conductive layer is treated such as form a surface solder pad and comprising an open cavity formed in the second insulating layer;

placing a first electronic component in the open cavity;

placing a second electronic component on the second insulating layer without overlapping with the open cavity; and soldering a termination of the first electronic component and a termination of the second electronic component on the surface solder pad;

wherein a single solder joint directly contacts the termination of the first electronic component, the termination of the second electronic component, and the surface solder pad.

8. The method of claim 7, further comprising, before or after insertion of the first electronic component into the open cavity, application of a soldering paste comprising a metallic alloy in suspension in a solder flux to the surface solder pad.

9. The method of claim 7, wherein the first electronic component is positioned at a bottom of the open cavity.

10. The method of claim 7, further comprising a step of attaching a metal layer on the second insulating layer and producing a second open cavity having a predefined pattern through said metal layer and the second insulating layer so as to form a mark.

* * * * *